(12) United States Patent
Hecht et al.

(10) Patent No.: US 6,507,231 B1
(45) Date of Patent: Jan. 14, 2003

(54) PROGRAMMABLE CLAMP FOR OUTPUT CIRCUIT

(75) Inventors: Bruce Hecht, Brookline, MA (US); Stephan Goldstein, Reading, MA (US); Robert Duris, Hubbardston, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/939,201

(22) Filed: Aug. 24, 2001

(51) Int. Cl.[7] ............................................... H03K 5/08
(52) U.S. Cl. ...................................................... 327/321
(58) Field of Search ........................... 326/30; 327/309, 327/310, 312, 313, 314, 318, 319, 321, 323, 324, 327, 328

(56) References Cited

U.S. PATENT DOCUMENTS

| | | | |
|---|---|---|---|
| 5,010,297 A | 4/1991 | Babcock | 324/158 R |
| 5,434,446 A | 7/1995 | Hilton et al. | 257/503 |
| 6,420,898 B2 * | 7/2002 | Huang et al. | 326/27 |

* cited by examiner

Primary Examiner—Jeffrey Zweizig
(74) Attorney, Agent, or Firm—Bromberg & Sunstein LLP

(57) ABSTRACT

A clamp for use with a circuit (having an output for delivering an output voltage) forms a voltage boundary for the output voltage based upon a clamp voltage. To that end, the clamp includes a clamp input for receiving the clamp voltage, a clamp transistor in communication with the clamp input, and a control transistor in communication with the output. The clamp also includes a driving source for driving at least one of the clamp and control transistors based upon the voltage at the clamp input and the voltage at the output. The output is clamped at a voltage within the voltage boundary of the clamp voltage after the clamp transistor begins being driven by the driving source.

20 Claims, 3 Drawing Sheets

US 6,507,231 B1

PROGRAMMABLE CLAMP FOR OUTPUT CIRCUIT

RELATED APPLICATION

This application is related to U.S. patent application Ser. No. 09/885,806, entitled, "CIRCUIT FOR CONDITIONING OUTPUT WAVEFORM," filed on Jun. 20, 2001, the disclosure of which is incorporated herein, in its entirety, by reference.

FIELD OF THE INVENTION

The invention relates generally to data signal generation and, more particularly, the invention relates to a circuit for clamping data signals delivered from a circuit.

BACKGROUND OF THE INVENTION

Testing equipment has been used for many years to evaluate the performance of integrated circuits prior to their shipment to customers. Among other things, testing equipment typically includes a large number of "pin cards" that each have circuitry for communicating with one corresponding pin of the integrated circuit being tested (referred to in the art as the "device under test," or "DUT"). Each pin card may include one or more so-called "pin drivers" for transmitting a test signal to its corresponding pin on the DUT. To that end, the pin driver typically is connected to its corresponding pin via a relatively short transmission line. For additional background information relating to testing equipment and pin drivers, see U.S. Pat. No. 5,010,297, the disclosure of which is incorporated herein, in its entirety, by reference.

During testing, the DUT often transmits signals back to the pin driver across the transmission line. There are instances, however, when such signals produce reflections (at the pin driver) that are reflected back to the DUT. Among other problems, reflections undesirably can distort data transmissions between the two devices. The art has responded to this problem by connecting a reflection clamp to the output pin of the pin driver to clamp the reflections to a specified minimum and/or maximum value. Such reflection clamps, however, also present a number of other problems. For example, such reflection clamps often consume excessive space in the layout, add capacitance, consume excessive power, and compromise the signal integrity of the data signals transmitted and received between the DUT and the pin driver.

SUMMARY OF THE INVENTION

In accordance with one aspect of the invention, a clamp for use with a circuit (having an output for delivering an output voltage) forms a voltage boundary for the output voltage based upon a clamp voltage. To that end, the clamp includes a clamp input for receiving the clamp voltage, a clamp transistor, and a control transistor. The clamp transistor has an input node (in communication with the clamp input) with a substantially fixed voltage based upon the clamp voltage. The clamp transistor also has a second terminal. The control transistor has an input node in communication with the output, and a second terminal. The second terminals of the clamp transistor and the control transistor are in communication with a current source that delivers current to at least one of the two transistors. The clamp transistor and control transistor receive current from the current source based upon the voltage difference between their respective input node and second terminal.

The output is clamped at a voltage within the voltage boundary after the clamp transistor begins receiving current from the current source.

In some embodiments, the clamp prevents the output voltage from being higher than the clamp voltage. In other embodiments, the clamp prevents the output voltage from being lower than the clamp voltage. The clamp transistor and the control transistor may be one of field effect transistors and bipolar junction transistors. In addition, the control transistor also may function as a part of the circuit delivering the output voltage.

The output may be clamped at the voltage within the voltage boundary after the control transistor stops receiving current from the current source. In some embodiments, the clamp further includes a bridge coupled between the clamp input and the input node of the clamp transistor. The bridge produces the substantially fixed voltage upon the input node of the clamp transistor.

In accordance with another aspect of the invention, a clamp for use with a circuit (having an output for delivering an output voltage) forms a voltage boundary for the output voltage based upon a clamp voltage. To that end, the clamp includes a clamp input for receiving the clamp voltage, a clamp transistor in communication with the clamp input, and a control transistor in communication with the output. The clamp also includes a driving source for driving at least one of the clamp and control transistors based upon the voltage at the clamp input and the voltage at the output. The output is clamped at a voltage within the voltage boundary of the clamp voltage after the clamp transistor begins being driven by the driving source.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a clamping device that is internal to a driver circuit clamps reflections to within the boundaries of a specified voltage range. Moreover, the clamping device uses circuitry that already is a part of the driver circuit to more efficiently execute its function. Details of illustrative embodiments are discussed below.

Figure 1:
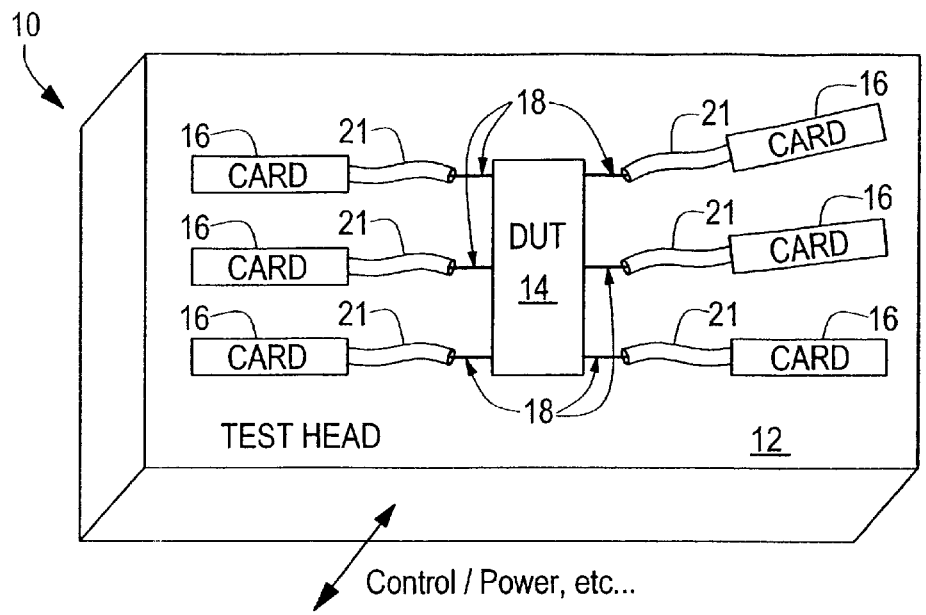
FIG. 1 schematically shows a test head that may be used with illustrative embodiments of the invention.

FIG. 1 schematically shows a portion of an automatic testing device 10 that may be configured in accordance with illustrative embodiments of the invention. In particular, the testing device 10 includes a test head 12 with a socket (not shown) for receiving a device to be tested. The device to be tested may be any device commonly tested by such testing equipment, such as an integrated circuit. By way of example, the integrated circuit may be a VLSI chip, or a memory chip. Those skilled in the art commonly refer to the device being tested as the "device under test," or the "DUT" (identified herein by reference number 14).

The test head 12 includes electronics for testing each pin 18 on the DUT 14. To that end, the test head 12 includes a plurality of testing cards 16 that each tests one pin 18 on the DUT 14. The DUT 14 shown in FIG. 1, for example, has six pins 18 and thus, the test head 12 includes six test cards 16 to test all the pins 18 on the DUT 14. Since test heads commonly have more than six test cards 16, it should be noted that six test cards 16 are shown as exemplary only and not as a limitation of various embodiments of the invention. In a similar manner, the DUT 14 can more than six pins 18. Accordingly, discussion of six pins 18 also is by example only and not intended to be a limitation on various embodiments of the invention.

Each test card 16 includes a driver circuit ("driver 20," shown in FIG. 2) for transmitting a test signal to the pin 18 that it is testing, and a comparator apparatus ("comparator 30A and 30B," shown in FIG. 2) for analyzing any data signal received from the pin 18. Of course, if the pin 18 is for receiving an input signal only, then only the driver 20 is used. In a similar manner, if the pin 18 is for transmitting an output signal only, then only the comparator apparatus is used. Moreover, if the pin 18 is for both input and output, then both the driver 20 and comparator apparatus may be used. Each test card 16 also includes an input for receiving control data, power, and other related information from another part (not shown) of the testing equipment.

Figure 2:
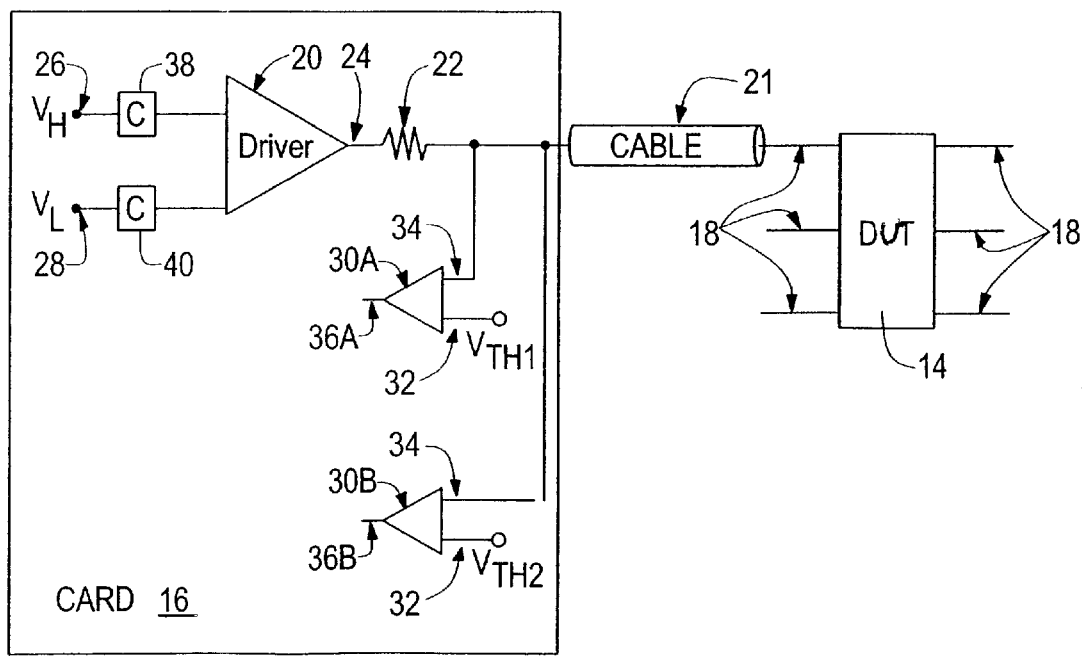
FIG. 2 schematically shows a testing card configured in accordance with illustrative embodiments of the invention for use in the test head shown in FIG. 1.

FIG. 2 schematically shows details of an exemplary testing card 16. In particular, the testing card 16 includes a driver 20 (noted above) that is connected to one pin 18 on the DUT 14 via a transmission cable 21. In illustrative embodiments, the transmission cable 21 has a characteristic impedance (e.g., about 50 ohms), and is terminated on its driver side by a termination resistor 22. It is customary for the combined resistance of the termination resistor 22 and the driver output to match the impedance of the transmission cable 21 (e.g., fifty ohms for a fifty ohm transmission cable 21). The driver 20 also includes an output ("driver output 24," which may be coupled to a pin that is external to the driver 20) for transmitting a testing signal to the DUT 14 (via the cable 21), and a pair of DC voltage inputs 26 and 28 for setting the maximum and minimum amplitude of the output testing signal. The DC voltage inputs 26 and 28 therefore include a high voltage input (referred to herein as "Vhigh input 26"), and a low voltage input (referred to as "Vlow input 28"). Exemplary voltages applied to the Vhigh and Vlow inputs 26 and 28 may be about 5 volts and 1 volt, respectively.

In addition to the above noted elements, the test card 16 also includes the prior noted comparator apparatus, which has a pair of comparators 30A and 30B. Each comparator 30A and 30B includes a threshold input 32 for receiving a DC threshold voltage, a return input 34 for receiving a data signal (from the DUT 14) to be compared against its respective threshold voltage, and a comparator output 36 for delivering output data reporting the results of the comparison. As known by those skilled in the art, each comparator 30A and 30B produces output data specifying the voltage of the received data signal relative to its threshold voltage. In various embodiments, the threshold voltage on one comparator 30A or 30B is set to be higher than that of the other comparator 30A or 30B. Accordingly, the higher threshold voltage is known as the "high threshold voltage," while the lower threshold voltage is known as the "low threshold voltage." Those skilled in the art should understand, however, that many different types of comparator devices can be used. Accordingly, the disclosed comparator apparatus is exemplary only and not intended to limit various embodiments of the invention.

Figure 3:
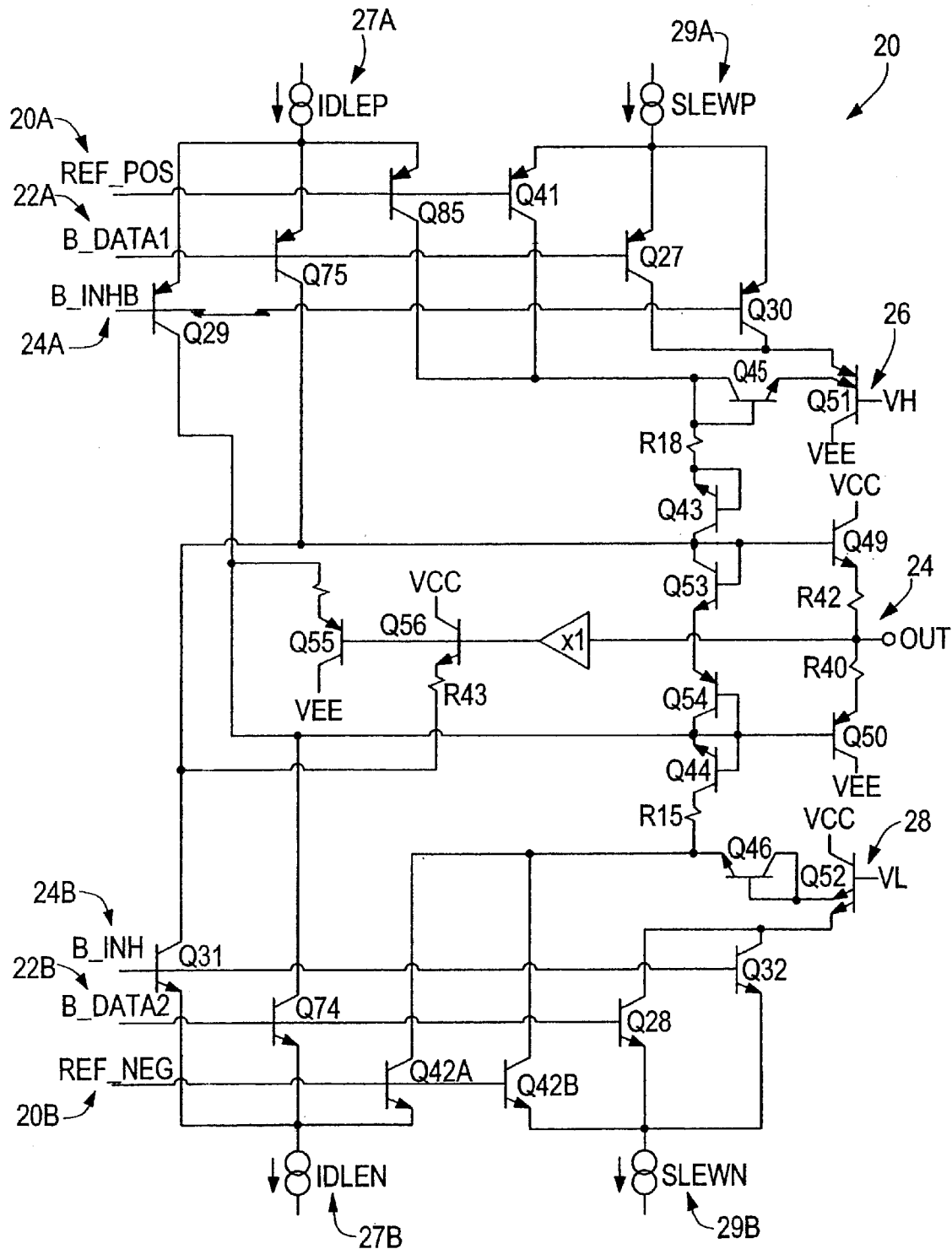
FIG. 3 schematically shows an exemplary driver that may be used in the testing card shown in FIG. 2.
Figures 4A, 4B:
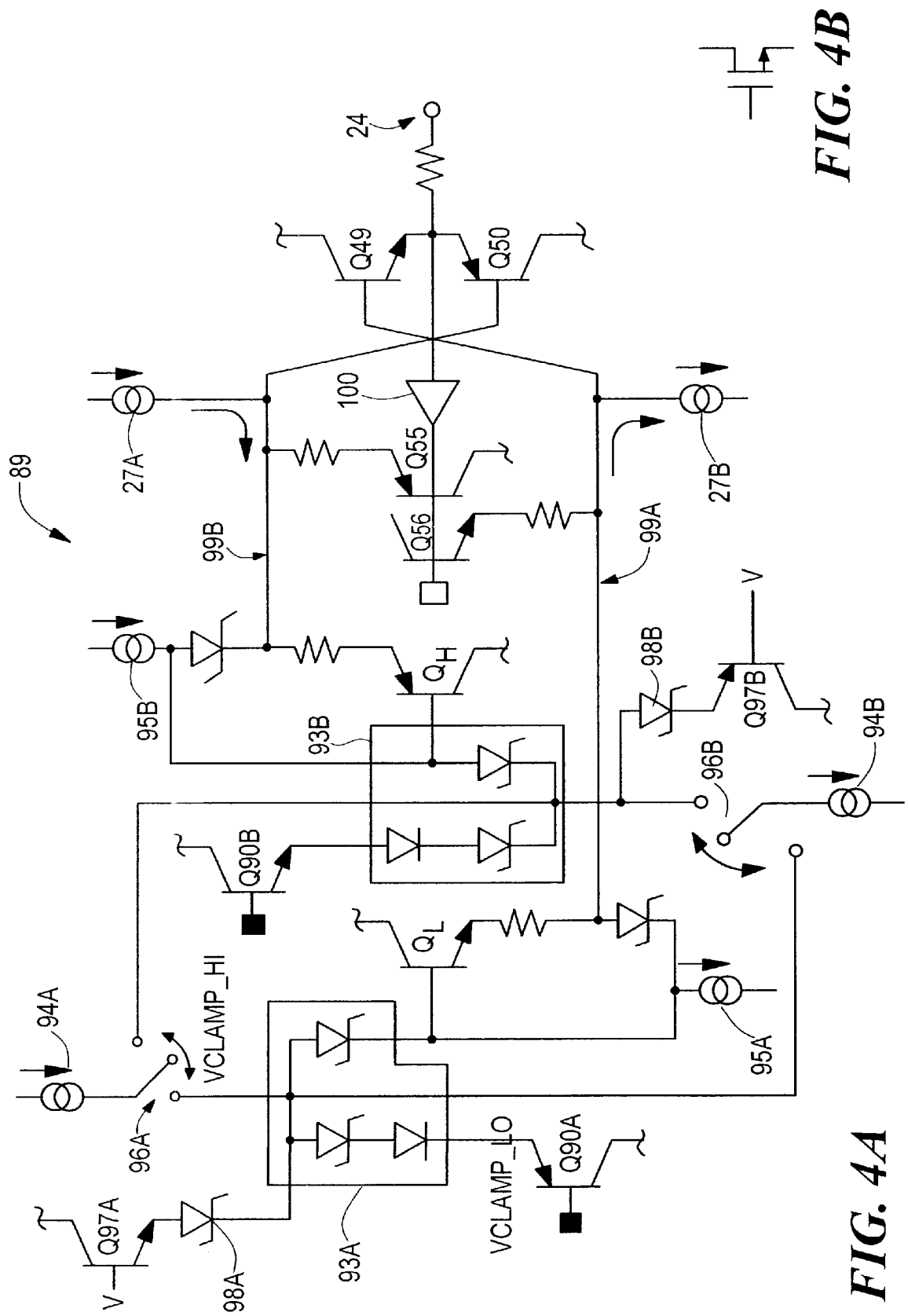
FIG. 4A schematically shows an illustrative embodiment of the clamp circuit implemented in the driver shown in FIG. 3.
FIG. 4B schematically shows a field effect transistor that may be used with alternative embodiments of the invention.

FIG. 3 schematically shows an exemplary circuit configuration that can be used for the driver 20 without the illustrative clamping circuit (shown in detail in FIG. 4A). The driver 20 includes a positive switching array of transistors (Q29, Q75, Q85, Q41, Q27, and Q30) for switching the flow of two positive current sources, a negative switching array of transistors (Q31, Q74, Q42A, Q42B, Q28, and Q32) for switching the flow of two negative current sources, a plurality of bridge transistors (Q45, Q43, Q44, and Q46) for directing current through the driver 20, a pair of power transistors (Q49 and Q50) for delivering power to the driver output 24, and a pair of diodes (Q53 and Q54) for keeping the power transistors Q49 and Q50 in an on state. In illustrative embodiments, the driver 20 is a Class-AB driver, which requires at least one power transistor to be on at all times while the driver 20 is operating. In addition, the driver 20 also includes a Vhigh transistor Q51 coupled with the Vhigh input 26, and a Vlow transistor Q52 coupled with the Vlow input 28. The driver 20 includes other elements, such as transistors Q55 and Q56, a unity gain buffer, and various resistors.

The switching transistors are controlled by a plurality of digital inputs. The digital inputs include three inputs for controlling the positive switching array, and three inputs for controlling the negative switching array. The three inputs for controlling the positive switching array include a positive reference input 20A for maintaining a constant applied input voltage, a positive data input 22A for switching between Vhigh and Vlow voltage modes (discussed below), and a positive inhibit input 24A for switching to an inhibit mode (discussed below). In addition, the three inputs for controlling the negative switching array include a negative reference input 20B for maintaining another constant applied input voltage, a negative data input 22B for switching between Vhigh and Vlow voltage modes (noted above and discussed below), and a negative inhibit input 24B for switching to the noted inhibit mode.

The current sources include a positive idle current source 27A for ensuring that specified transistors remain "on," and a positive slew current source 29A for providing the appropriate rising output voltage as desired at the driver output 24. A corresponding negative idle current source 27B and negative slew current source 29B also are included for similar functions.

The operation of the driver 20 in FIG. 3 now will be discussed. It should be noted that this description of FIG. 3 is made without the clamping circuit being included. Details of the clamping circuit within the driver 20 are shown in FIG. 4A.

When in operation, an effective capacitance at the node having transistors Q43, Q53, Q54, Q44 and the bases of transistors Q49 and Q50 is charged and discharged, thus causing the output signal to change between Vhigh and Vlow. In particular, when the driver output voltage is transitioning from Vlow to Vhigh, the positive data input 22A has a voltage applied to it that is higher than that applied to the reference input 20A, thus turning on transistors Q85 and Q41. In a corresponding manner, the negative data input 22B also has a voltage applied to it that is higher than that applied to the negative reference input 20B, thus turning on transistors Q74 and Q28. All other switching transistors are off.

As a consequence of the noted switching transistors being on, the positive idle current and negative idle current are connected, thus passing current through the path formed by transistors Q85, Q43, Q53, Q54, and Q74. In addition, the positive slew current passes through the path formed by transistors Q41, Q43, and Q53. At the collector of Q53, which also is the base of the power transistor Q49, which connects to the driver output 24, the above noted effective capacitance charges to a maximum voltage of Vhigh plus one V-base-emitter voltage, thus causing the driver output 24 to rise to a voltage of Vhigh.

Operation of the driver 20 as its output voltage transitions from Vhigh to Vlow now will be discussed. In general, the output voltage is reduced by discharging the above noted effective capacitance. In particular, when the driver output voltage is transitioning from Vhigh to Vlow, the positive data input 22A has an applied voltage that is lower than that of the positive reference input 20A, thus turning on transistors Q75 and Q27. In a corresponding manner, the negative data input 22B has an applied voltage that is lower than that of the negative reference input 20B, thus turning on transistors Q42A and Q42B. All other switching transistors are off.

As a result of the noted switching transistors being on, the positive idle current and negative idle current are connected, thus passing current through the path formed by transistors Q75, Q53, Q54, and Q44, and Q42A. In addition, the positive slew current passes through the path formed by transistors Q27 and Q51, and is transmitted out via VEE of Q51. At the collector of Q54 (which also is the base of output device Q50, which is connected to the driver output 24), the above noted effective capacitance discharges causing the base of Q50 to discharge from its maximum voltage of Vhigh minus one V-base-emitter voltage, to its minimum voltage of Vlow minus one V-base-emitter voltage, thus causing the driver output 24 to discharge to Vlow. Accordingly, the negative slew current, which is drawn from the discharging capacitance, passes through transistors Q54, Q44, and Q42B. It should be noted that the idle current and negative slew current both have a common sub-path through Q54 and Q44. Due to the discharging capacitance, the output voltage drops toward the minimum voltage Vlow.

There are instances when the idle and slew currents within the driver 20 are switched to cause the driver output 24 to have a very high impedance. Stated another way, when in this mode (referred to herein as "inhibit mode"), the driver output 24 appears to be an open circuit to a coupled load. To this end, the positive and negative inhibit inputs 24A and 24B are set so that transistors Q29, Q30, Q31, and Q32 are on. All other switching transistors are off. This directs all current away from the bridge transistors (Q42, Q53, Q54, Q44 and Q46) and the power transistors (Q49 and Q50). To that end, the positive idle current passes through Q29 and Q55, and the negative idle current passes through transistors Q56 and Q31. In a similar manner, the positive slew current passes through transistors Q30 and Q51, while the negative slew current passes through transistors Q52 and Q32.

As known by those skilled in the art, an open circuit produces relatively large reflections when it receives a signal. Among other problems, these reflections can interfere with transmissions to and from the DUT 14. Accordingly, in illustrative embodiments of the invention, the prior noted and below discussed clamping circuit is coupled within the driver 20 to clamp reflections to within a set voltage range. This voltage range may be set by a testing engineer to an acceptable level. As discussed below, the clamp circuit preferably is used when the driver 20 is in the inhibit mode only. When not in the inhibit mode, the clamp circuit is turned off and thus, has no significant effect on the rest of the driver circuit.

FIG. 4A schematically shows the clamp circuit (identified by reference number 89) configured in accordance with illustrative embodiments of the invention. The clamp circuit 89 includes two corresponding high-clamp and low-clamp portions that clamp the output voltage at respectively high and low voltages. More particularly, the low-clamp portion includes a low clamp input transistor Q90A for receiving a low clamping voltage (i.e., the minimum clamp voltage) and a low clamping transistor QL for providing the low voltage clamp. In addition, the low-clamp portion also includes a low bridge 93A for maintaining the base voltage at about two diode drops above the low clamping voltage, a low bridge current source 94A to energize the low bridge 93A, and a low-side current source 95A.

As discussed in greater detail below, the low-clamp portion also includes a switch 96A to alternatively switch between a clamping mode when the driver 20 is in the inhibit mode, and a non-clamping mode when the driver 20 is not in the inhibit mode (i.e., when the driver is in the active mode). When the switch 96A connects the low bridge current source 94A to the low bridge 93A, current from that source 94A energizes the low bridge 93A, thus maintaining the voltage at the base of the low clamping transistor QL at the aforementioned set voltage. When the switch 96A does not connect with the low bridge 93A, then a low-side current diverting transistor Q97A begins transmitting a current through a Schottky diode 98A. To that end, a constant voltage preferably is maintained at the base of the low-side diverting transistor Q97A, which causes such transistor Q97A to turn on when the switch is appropriately set.

The low bridge 93A may be any bridge that maintains a constant voltage on the base of the low clamping transistor QL. In illustrative embodiments, the low bridge 93A includes a single diode with two Schottky diodes connected as shown. Also in illustrative embodiments, the low clamping transistor QL and low-side diverting transistor 97A are NPN transistors, while the low-clamp input transistor Q90A is a PNP transistor. Those skilled in the art should understand, however, that other types of transistors may be used to effectuate the same result. For example, field effect transistors may be used (e.g., see FIG. 4B), or bipolar junction transistors with differing polarities also may be used. Discussion of specific circuit elements thus is not intended to limit the scope of the invention.

In illustrative embodiments, the high-clamp portion of the clamp circuit 89 has a similar but opposite configuration as that of the low-clamp portion. Specifically, the high-clamp portion of the clamp circuit includes a high clamp input transistor Q90B for receiving a high clamping voltage (i.e., the maximum clamp voltage) and a high clamping transistor QH for providing the high voltage clamp. In addition, the high-clamp portion also includes a high bridge 93B for maintaining the base voltage at about two diode drops below the high clamping voltage, a high bridge current source 94B to energize the high bridge 93B, and a high-side current source 95B.

As discussed in greater detail below, the high-clamp portion also includes a switch 96B to alternatively switch between a clamping mode when the driver 20 is in the inhibit mode, and a non-clamping mode when the driver 20 is not in the inhibit mode (i.e., when the driver 20 is in the active mode). When the switch 96B connects the high bridge current source 94B to the high bridge 93B, current from that source 94B energizes the high bridge 93B, thus maintaining the voltage at the base of the high clamping transistor QH at the aforementioned set voltage. When the switch 96B does not connect with the high bridge 93B, then a high-side current diverting transistor Q97B begins transmitting a current through a Schottky diode 98B. To that end, a constant voltage preferably is maintained at the base of the high-side diverting transistor Q97B, which causes such transistor Q97B to turn on when the switch 96B is appropriately set.

The high bridge 93B may be any bridge that maintains a constant voltage on the base of the high clamping transistor QH. In illustrative embodiments, the high bridge 93B is a single diode with two Schottky diodes connected as shown. Also in illustrative embodiments, the high clamping transistor QH and high-side diverting transistor Q97B are PNP transistors, while the high-clamp input transistor Q90B is an NPN transistor. Those skilled in the art should understand, however, that other types of transistors may be used to effectuate the same result. Discussion of specific circuit elements thus is not intended to limit the scope of the invention.

As also shown in FIG. 4A, the base of transistor Q56 is coupled to the output via a unity gain buffer 100, while its emitter is coupled to a low-side node 99A (via a resistor) that also is coupled with the emitter of the low clamping transistor QL (via a resistor). Accordingly, both transistor Q56 and transistor QL will effectively be competing for the idle current from the idle current source 27B based upon their base voltages, and the voltage of their common node (i.e., the low-side node 99A).

In a similar manner, the base of transistor Q55 also is coupled to the output via the unity gain buffer 100, while its emitter is coupled to a high-side node 99B (via a resistor) that also is coupled with the emitter of the low clamping transistor QL (via a resistor). Accordingly, both transistor Q56 and transistor QL will effectively be competing for the idle current from the idle current source 27A based upon their base voltages, and the voltage of their common node (i.e., the high-side node 99B).

Operation of the clamp circuit now will be discussed. First, the low-clamp portion will be discussed as the output voltage swings to the low-clamping voltage. The high-clamp portion then will be discussed as the output voltage swings to the high-clamping voltage. These two portions will be discussed by example as having a low-clamping voltage of one volt and a high-clamping voltage of three volts. For simplicity, voltage drops provided by attached resistors are ignored in this example. Of course, those resistor voltage drops should be considered when building the clamping circuit 89.

In this illustrative example, the base of the low clamp input transistor Q90A is held at one volt. Consequently, the base of the low clamping transistor QL has a fixed voltage of about 2.4 volts (i.e., approximating base to emitter voltage drops as being 0.7 volts). The base of transistor Q56 (the control transistor, which is a part of the driver 20 itself) is coupled with the output 24 and thus, has a voltage that tracks that of the output 24.

When the output 24 is at three volts, the control transistor Q56 is on (i.e., being driven by the idle current source 27B), and the low clamping transistor QL is off. Consequently, the voltage of the low-side node 99A is 2.3 volts (i.e., 3.0 volts less 0.7 volts from the control transistor Q56). Those skilled in the art should understand that the low clamping transistor QL is off since its base to emitter voltage is 0.1 volts (i.e., 2.4 volts less 2.3 volts). The power transistor Q49 consequently is off since its base to emitter voltage is −0.7 volts.

As the output 24 voltage drops toward one volt, the voltage of the low-side node 99A drops (to a point, noted below) while the idle current source 27B continues to drive the control transistor Q56. When the output voltage reaches 2.4 volts, the low-side node 99A has a voltage of 1.7 volts. As a consequence, the low clamping transistor QL begins being driven by the idle current source 27B because the its base to emitter voltage equals 0.7 volts (i.e., 2.4 volts less 1.7 volts). The power transistor Q49 remains off since it still has a negative base to emitter voltage.

After this point (i.e., as the output voltage continues to approach one volt), the low-side node 99A voltage remains substantially constant at 1.7 volts because the control transistor Q56 eventually turns off, while the low clamping transistor QL continues to be driven by the idle current source 27B. Accordingly, when the output voltage is one volt, the control transistor Q56 remains off, and the low clamping transistor QL continues to be driven by the idle current source 27B. The power transistor Q49 then turns on since its base to emitter voltage is 0.7 volts (i.e., the low-side node 99A voltage of 1.7 volts less the output voltage of 1 volt). The power transistor Q49 thus remains on, clamping the minimum output voltage at one volt.

An analogous process occurs with the high clamp portion of the clamping circuit 89 as the output voltage changes from one to three volts. More particularly, the base of the high clamp input transistor Q90B is held at three volts. Consequently, the base of the high clamping transistor QH has a fixed voltage of about 1.6 volts (i.e., two voltage drops less than 3.0 volts). The base of transistor Q55 (the control transistor, which is a part of the driver 20 itself) is coupled with the output 24 and thus, has a voltage that tracks that of the output 24.

When the output 24 is at one volt, the control transistor Q55 is on (i.e., being driven by the idle current source 27A), and the high clamping transistor QH is off. Consequently, the voltage of the high-side node 99B is 1.7 volts (i.e., 1 volt plus 0.7 volts from the control transistor Q55, which is a PNP transistor). Those skilled in the art should understand that the high clamping transistor QH is off since its base to emitter voltage is −0.1 volts (i.e., 1.6 volts less 1.7 volts). The power transistor Q50 consequently is off since its base to emitter voltage is 0.7 volts.

As the output voltage rises toward three volts, the voltage of the high-side node 99B increases (to a point, noted below) while the idle current source 27A continues to drive the control transistor Q55. When the output voltage reaches 1.6 volts, the high-side node 99B has a voltage of 2.3 volts. As a consequence, the high clamping transistor QH begins being driven by the idle current source 27A because the its base to emitter voltage equals −0.7 volts (i.e., 1.6 volts less 2.3 volts). The power transistor Q50 remains off since it still has a positive base to emitter voltage.

After this point (i.e., as the output voltage continues to approach three volts), the high-side node 99B voltage remains substantially constant at 2.3 volts because the control transistor Q55 eventually turns off, while the high clamping transistor QH continues to be driven by the idle current source 27A. Accordingly, when the output voltage is three volts, the control transistor Q55 remains off, and the high clamping transistor QH continues to be driven by the idle current source 27A. The power transistor Q50 then turns on since its base to emitter voltage is −0.7 volts (i.e., the high-side node 99B voltage less the output voltage). The power transistor Q50 thus remains on, clamping the maximum output voltage at three volts.

As noted above, in illustrative embodiments, the clamping circuit 89 is activated when the driver 20 is in the inhibit mode only. When not in the inhibit mode, the switches 96A and 96B are positioned in their other position to divert current from the low clamping transistor QL, low bridge 93A, high clamping transistor QH, and high bridge 93B. Accordingly, these elements are off, thus taking the clamp circuit 89 out of the driver 20. The driver 20 thus can operate without undesired influence from such elements.

Although various exemplary embodiments of the invention have been disclosed, it should be apparent to those skilled in the art that various changes and modifications can be made that will achieve some of the advantages of the invention without departing from the true scope of the invention. These and other obvious modifications are intended to be covered by the appended claims.

We claim:

1. A clamp for use with a circuit having an output for delivering an output voltage, the clamp forming a voltage boundary for the output voltage based upon a clamp voltage, the clamp comprising:

a clamp input for receiving the clamp voltage;

a clamp transistor having an input node in communication with the clamp input, the input node having a substantially fixed voltage based upon the clamp voltage, the clamp transistor also having a second terminal; and a control transistor having an input node in communication with the output, the control transistor also having a second terminal, the second terminals of the clamp transistor and the control transistor being in communication with a current source that delivers current to at least one of the two transistors, the clamp transistor and control transistor receiving current from the current source based upon the voltage difference between their respective input node and second terminal, the output being clamped at a voltage within the voltage boundary after the clamp transistor begins receiving current from the current source.

2. The clamp as defined by claim 1 wherein the clamp prevents the output voltage from exceeding the clamp voltage.

3. The clamp as defined by claim 1 wherein the clamp prevents the output voltage from being lower than the clamp voltage.

4. The clamp as defined by claim 1 wherein the clamp transistor and the control transistor are one of field effect transistors and bipolar junction transistors.

5. The clamp as defined by claim 1 wherein the control transistor also functions as a part of the circuit delivering the output voltage.

6. The clamp as defined by claim 1 wherein the output is clamped at the voltage within the voltage boundary after the control transistor stops receiving current from the current source.

7. The clamp as defined by claim 1 further including a bridge coupled between the clamp input and the input node of the clamp transistor, the bridge producing the substantially fixed voltage upon the input node of the clamp transistor.

8. A clamp for use with a circuit having an output for delivering an output voltage, the clamp forming a voltage boundary for the output voltage based upon a clamp voltage, the clamp comprising:

a clamp input for receiving the clamp voltage;

a clamp transistor in communication with the clamp input;

a control transistor in communication with the output; and a driving source for driving at least one of the clamp and control transistors based upon the voltage at the clamp input and the voltage at the output, the output being clamped at a voltage within the voltage boundary of the clamp voltage after the clamp transistor begins being driven by the driving source.

9. The clamp as defined by claim 8 wherein the clamp prevents the output voltage from exceeding the clamp voltage.

10. The clamp as defined by claim 8 wherein the clamp prevents the output voltage from being lower than the clamp voltage.

11. The clamp as defined by claim 8 wherein the clamp transistor and the control transistor are one of field effect transistors and bipolar junction transistors.

12. The clamp as defined by claim 8 wherein the output is connected to an output pin that is external to the circuit, the clamp transistor not being connected to the output pin and being internal to the circuit.

13. The clamp as defined by claim 8 wherein the output is clamped at the voltage within the voltage boundary after the control transistor stops being driven by the driving source.

14. The clamp as defined by claim 8 further including a bridge coupled between the clamp input and the clamp transistor, the bridge producing a substantially fixed voltage upon one node of the clamp transistor.

15. A clamp for use with a circuit having an output for delivering an output voltage, the clamp forming a voltage boundary for the output voltage based upon a clamp voltage, the clamp comprising:

an input for receiving the clamp voltage;

a clamp transistor in communication with the clamp input;

a control transistor in communication with the output; and means for driving at least one of the clamp and control transistors based upon the voltage at the clamp input and the voltage at the output, the output being clamped at a voltage within the voltage boundary of the clamp voltage after the clamp transistor begins being driven by the driving means.

16. The clamp as defined by claim 15 wherein the clamp prevents the output voltage from exceeding the clamp voltage.

17. The clamp as defined by claim 15 wherein the clamp, prevents the output voltage from being lower than the clamp voltage.

18. The clamp as defined by claim 15 wherein the control transistor also functions as a part of the circuit to delivering the output voltage.

19. The clamp as defined by claim 15 wherein the output is clamped at the voltage within the voltage boundary after the control transistor stops being driven by the driving means.

20. The clamp as defined by claim 15 further including means for producing a substantially fixed voltage upon one node of the clamp transistor.

* * * * *